United States Patent [19]
Grill et al.

[11] Patent Number: 6,017,814
[45] Date of Patent: Jan. 25, 2000

[54] STRUCTURE AND FABRICATION METHOD FOR STACKABLE, AIR-GAP-CONTAINING LOW EPSILON DIELECTRIC LAYERS

[75] Inventors: Alfred Grill, White Plains; Katherine Lynn Saenger, Ossining, both of N.Y.

[73] Assignee: International Business Machines Corporation, Armonk, N.Y.

[21] Appl. No.: 09/192,133

[22] Filed: Nov. 13, 1998

Related U.S. Application Data

[62] Division of application No. 08/596,909, Mar. 13, 1996, Pat. No. 5,869,880.

[51] Int. Cl.[7] .................................................. H01L 21/44
[52] U.S. Cl. ........................................ 438/619; 438/624
[58] Field of Search ................................. 438/619, 624, 438/626, 631

[56] References Cited

U.S. PATENT DOCUMENTS

| | | | |
|---|---|---|---|
| 4,169,000 | 9/1979 | Riseman | 148/187 |
| 5,461,003 | 10/1995 | Havemann et al. | 437/187 |
| 5,462,784 | 10/1995 | Grill et al. | 428/65.5 |
| 5,559,367 | 9/1996 | Cohen et al. | 257/77 |
| 5,783,864 | 7/1998 | Dawson et al. | 257/758 |
| 5,814,555 | 9/1998 | Bandyopadhyay et al. | 438/619 |

OTHER PUBLICATIONS

J. E. Cronin et al., IBM TDB 32/8A, 88 (Jan. 1990).
K. Daetwyler et al., IBM TDB 31/4, 266 (Sep. 1988).

*Primary Examiner*—Caridad Everhart
*Attorney, Agent, or Firm*—Robert M. Trepp

[57] ABSTRACT

A structured dielectric layer and fabrication process for separating wiring levels and wires within a level on a semiconductor chip is described incorporating a lower dielectric layer having narrow air gaps to form dielectric pillars or lines and an upper dielectric layer formed over the pillars or fine lines wherein the air gaps function to substantially reduce the effective dielectric constant of the structured layer. The invention overcomes the problem of solid dielectric layers which would have the higher dielectric constant of the solid material used.

1 Claim, 5 Drawing Sheets

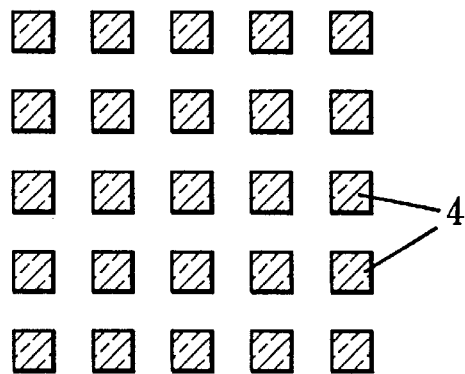
FIG. 3
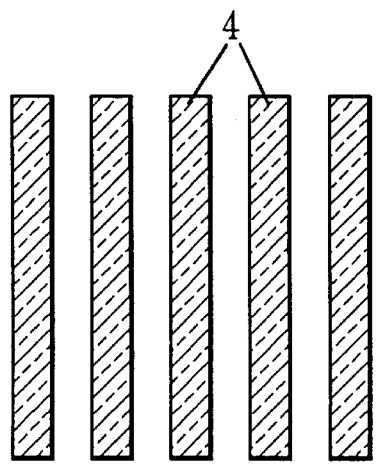
FIG. 4
FIG. 5
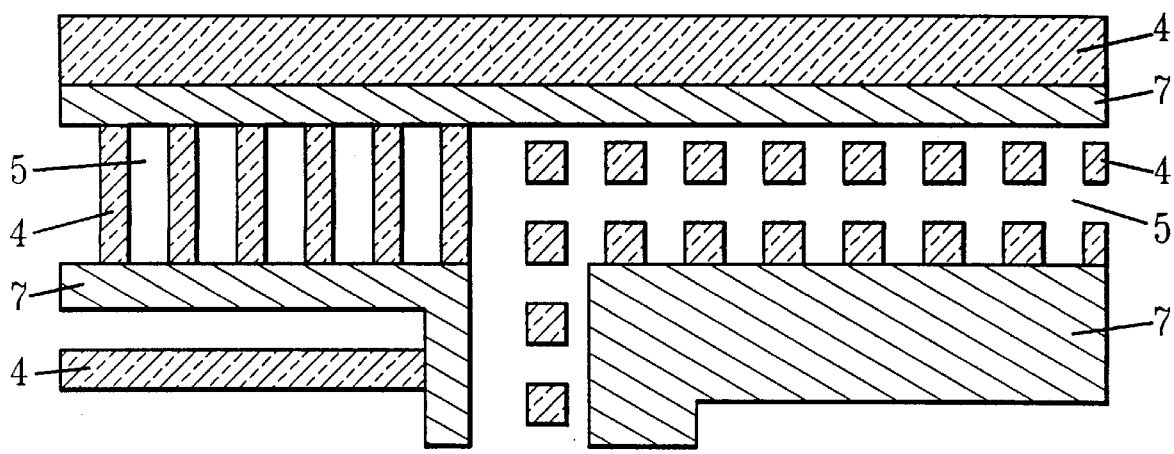

STRUCTURE AND FABRICATION METHOD FOR STACKABLE, AIR-GAP-CONTAINING LOW EPSILON DIELECTRIC LAYERS

This is a division of application Ser. No. 08/596,909, filed Mar. 13, 1996, now U.S. Pat. No. 5,869,880.

FIELD OF THE INVENTION

This invention relates to dielectric structures containing wiring for integrated circuit chips and more particularly to structured dielectric layers incorporating air gaps for low epsilon values.

BACKGROUND OF THE INVENTION

A semiconductor chip consists of an array of devices whose contacts are interconnected by patterns of metal wiring. In very large scale integration (VLSI) chips, these metal patterns are multilayered and are separated by layers of an insulating material, characterized by a dielectric constant. Interlevel contacts between metal wiring layers are made by through-holes or vias, which are etched through the layers of the insulating material. Typical integrated circuit chip designs utilize one or more wiring levels. Insulating or dielectric materials are employed between the wires in each level (intralevel dielectric) and between the wiring levels (interlevel dielectric).

In VLSI chips, the insulating material is typically silicon dioxide with a dielectric constant epsilon of about 3.9 to about 4.1. As the speed requirements of the chip are increased, the RC value of the circuits must be reduced such as by reducing the circuit capacitance. The quest for higher density or integration on chips results in shrinking dimensions which tends to increase the circuit capacitance. Thus there is a need in the future for a dielectric material or structure with a reduced effective epsilon. Dielectric materials or structures with lower dielectric values are being investigated as replacements for the silicon dioxide insulator. However, some materials with significantly lower dielectric constants are thermally unstable at temperatures required to process or manufacture the VLSI chips.

In U.S. Pat. No. 4,169,000 which issued on Sept. 25, 1979 to J. Riseman and assigned to the assignee herein, an air-isolated integrated circuit structure with a planar wirable surface is described. Cavities were etched into the substrate and a silicon dioxide layer was formed over the substrate and cavities. Next, a silicon dioxide layer supported by another substrate is abutted and fused to the original silicon dioxide layer enclosing the air cavities. The supporting substrate over the fused silicon dioxide layer is removed leaving a planar dielectric surface.

In U.S. Pat. No. 5,461,003 which issued on Oct. 24, 1995 to R. H. Havemann et al., a method for forming air gaps between metal leads of a semiconductor device is described. A disposable solid layer is formed between metal leads. A porous dielectric layer is then formed over the disposable solid layer and the metal leads. The disposable solid layer is then removed through the porous dielectric layer to form air gaps between the metal leads beneath the porous dielectric layer.

A structure and method for making multilevel air bridge wiring is described in a publication by J. E. Cronin et al. IBM TDB 32/8A 88 (January 1990). An earlier publication published anonymously, IBM TDB 31/4 266 (September 1988) described a partially-supported bridge structure.

SUMMARY OF THE INVENTION

In accordance with the present invention, a structure and fabrication method is described for structured dielectric layers having effective epsilons in the range from 2.0 to 3.5. The structured dielectric layers can be readily stacked on top of one another, and have low epsilons because a significant volume fraction of the structured dielectric layer consists of lithographically defined air gaps having an epsilon value of 1.0. Each dielectric layer is originally patterned and filled with wiring metal; excess wiring metal over the dielectric is removed. The dielectric is then etched slightly to lower the upper dielectric surface with respect to the upper surface of the wiring metal. The dielectric is then etched through a mask, preferably by an anisotropic etching process such as RIE to leave pillars or lines of the dielectric with air gaps in between. A layer of dielectric which may be 10 percent of the original dielectric thickness is then formed over the patterned dielectric, air gaps and metal preferably in such a manner as to not fill the air gaps. The upper dielectric surface is then planarized to be coplanar with the wiring metal.

BRIEF DESCRIPTION OF THE DRAWING

These and other features, objects, and advantages of the present invention will become apparent upon consideration of the following detailed description of the invention when read in conjunction with the drawings in which:

FIG. 3 is a top view of a plurality of dielectric pillars formed in a dielectric layer.

FIG. 4 is a top view of a plurality of dielectric lines formed in a dielectric layer.

FIG. 5 is a top view of a plurality of dielectric pillars and lines formed in a dielectric layer with wiring metal also formed earlier in the dielectric layer.

DESCRIPTION OF THE PREFERRED EMBODIMENTS

Figure 1:
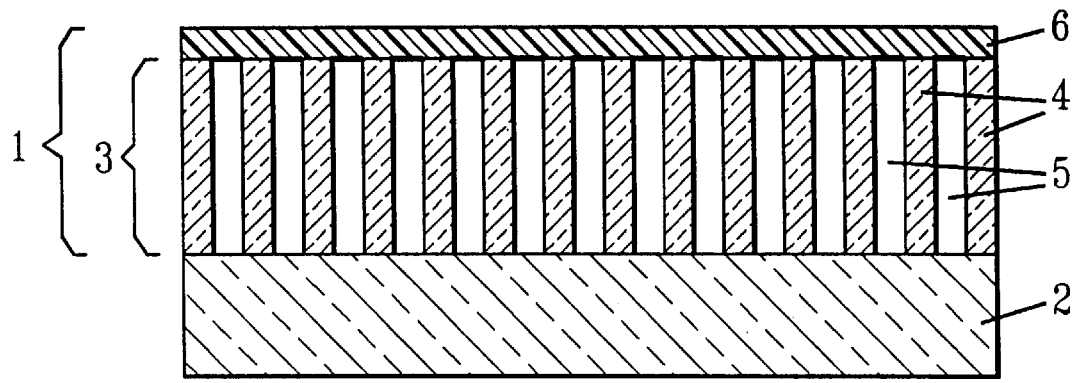
FIG. 1 shows a cross section view of a first embodiment of a structured dielectric layer of the invention.

Referring now to the drawing, FIG. 1 shows a cross section view of a structured dielectric layer 1 built on substrate 2. The structured dielectric layer 1 might typically be about 1 $\mu$m thick and consists of two components. The bottom component 3 of the dielectric layer (about 90% of the total layer thickness) consists of densely packed, fine-dimensioned dielectric features 4 separated by narrow gaps 5. The dielectric features 4 and gaps 5 might be, for example, $SiO_2$ lines whose width 4 and separation 5 are 0.15 $\mu$m. The top component 6 of the dielectric layer (about 10% of the total layer thickness) is a planar cap or "ceiling" layer which (i) is supported by the underlying patterned dielectric structures, and (ii) does not fill the gaps between the patterned dielectric structures.

Figure 2:
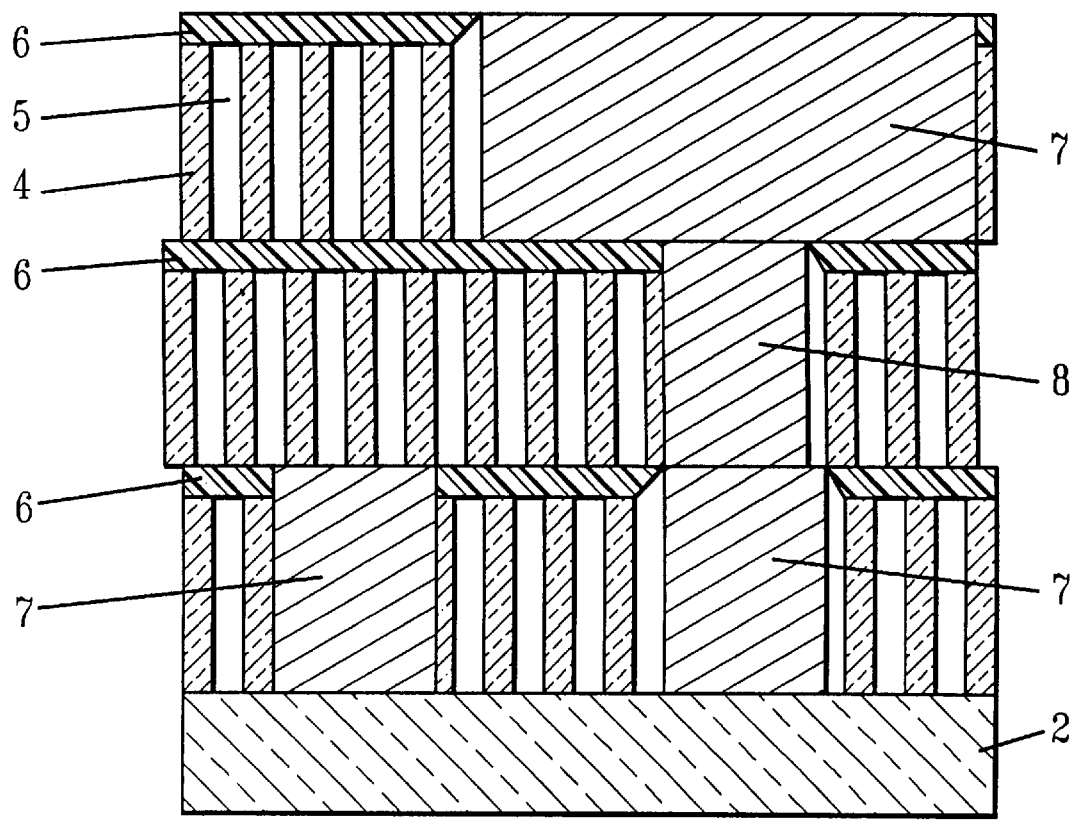
FIG. 2 shows a cross section view of how the structured dielectric layers of this invention may be stacked and integrated with metal wiring.

Since each structured layer is planar, a stack of structured layers will also be planar. Stacking is relatively simple, since the hermetically sealing top cap layer of the structured dielectric also provides a continuous surface for the next layer. A stacked structure containing the disclosed structured dielectric with embedded metal lines 7 and vias 8 is illustrated in FIG. 2 for the case of two wiring levels and one via level.

Depending on the geometry, fill factors for the bottom dielectric component can be as low as 1:2 (i.e., 50% fill, line geometry, top view FIG. 4) or even 1:4 (i.e., 25% fill, pillar geometry, top view FIG. 3). The approximate effective epsilon of the structured dielectric layer with top and bottom components having a thickness ratio of 1:9 is calculated to be low as 2.0 for a pillar geometry and top and bottom dielectrics of $SiO_2$ (1:4 fill, 10%*4+22.5%*4 +67.5%*1). With a less favorable line geometry fill ratio and substitution of $Si_3N_4$(epsilon=7) for the top dielectric, the structured layer would have an approximate effective epsilon of 3.0 (1:2 fill, 10%*7+45%*4+45%*1). The layout of the patterned dielectric structures may be the same throughout the layer (i.e., a small or large repeat length pattern replicated throughout the layer without regard to the pattern of the embedded wiring), or be completely personalized for a specific wiring layout. FIG. 5 shows a layer containing metal wiring 7, patterned dielectric 4, and air gaps 5, in which the dielectric patterns have been personalized.

Figure 6A:
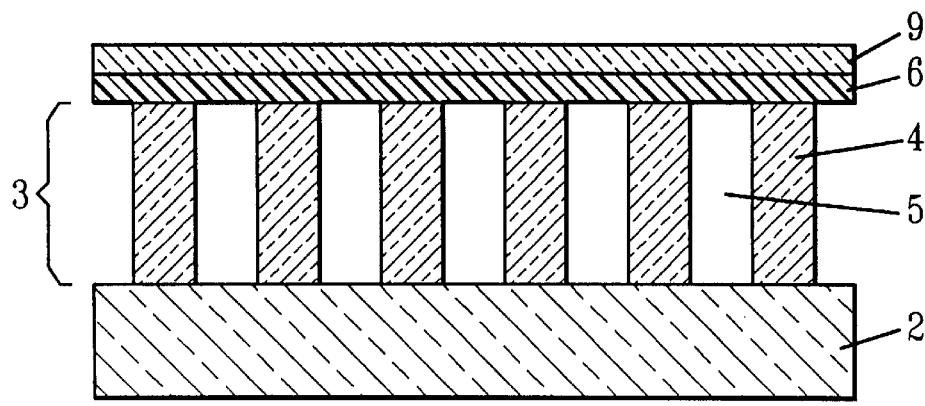
FIGS. 6A–6C are cross section views of 3 alternative embodiments of the structured dielectric layer of FIG. 1.
Figure 6B:
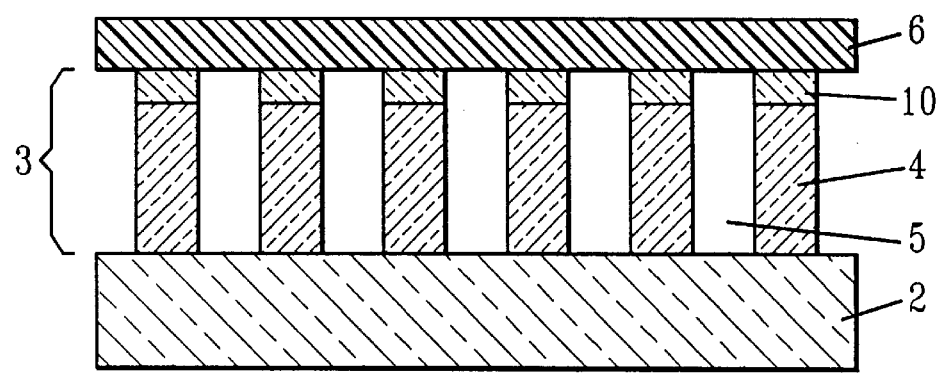
Figure 6C:
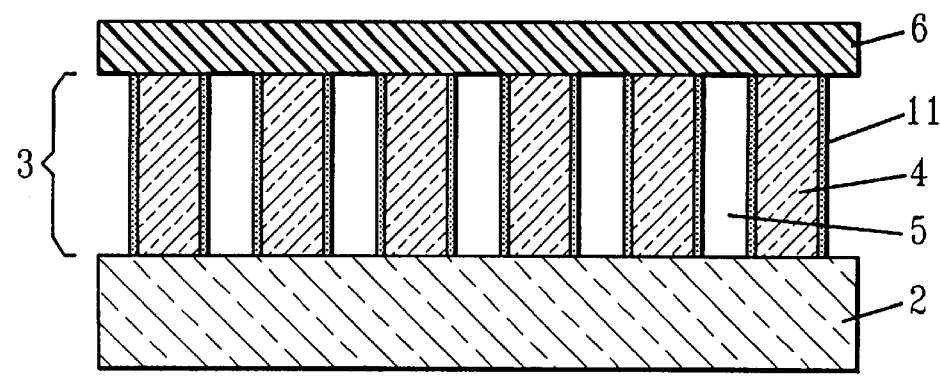

Variations of the basic structured dielectric structure are shown in FIG. 6(a–c). FIG. 6a shows a structured dielectric structure in which the thin, continuous top dielectric 6 is replaced by two thin, continuous layers of dielectric 6 and dielectric 9. FIG. 6b shows a structured dielectric structure in which the patterned bottom dielectric layer 3 is replaced by a patterned bilayer of two dielectric materials 4 and 10; FIG. 6c shows a structured dielectric structure in which the patterned features of the bottom dielectric 4 are coated on their sidewalls with some other material 11 (e.g., a non-wetting agent).

The key fabrication steps in one method to produce the structure of FIG. 2 with a Damascene metallization process are listed below and illustrated in FIG. 7.

Figure 7A:
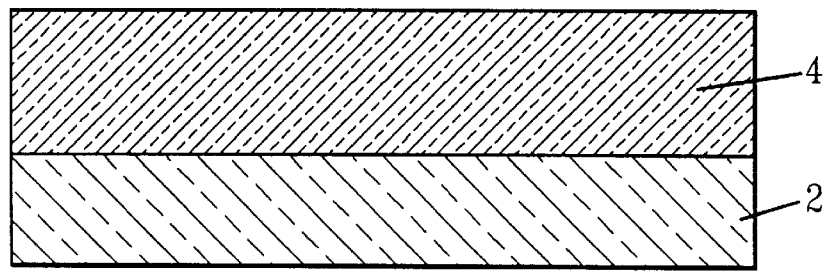
FIGS. 7A–7G are cross section views showing fabrication steps in one method to produce the structure of FIG. 2.

Deposit a blanket layer of dielectric 4 on substrate 2 (FIG. 7a).

Figure 7B:
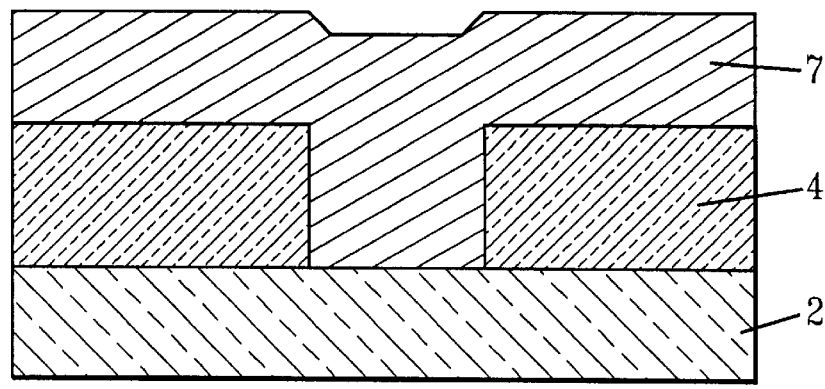
Figure 7C:
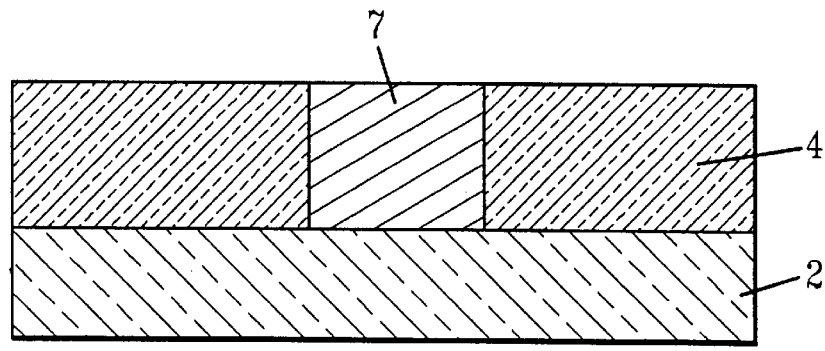

Pattern the dielectric and blanket deposit a conductive wiring material 7 (FIG. 7b).

Figure 7D:
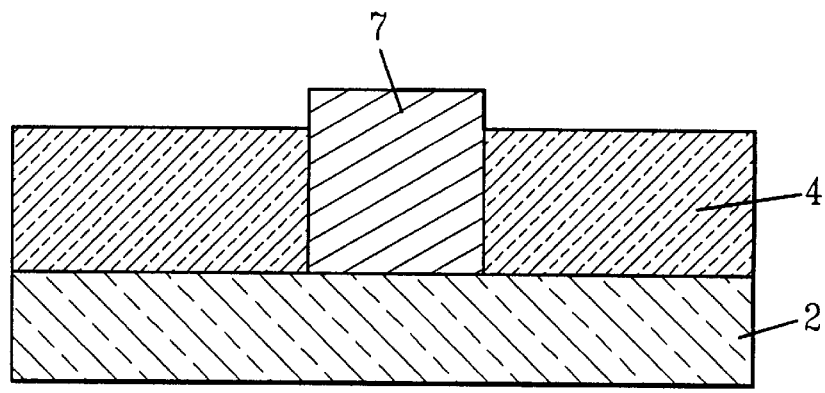

Planarize the wiring material 7 (FIG. 7c) and slightly overetch the dielectric 4 (FIG. 7d).

Figure 7E:
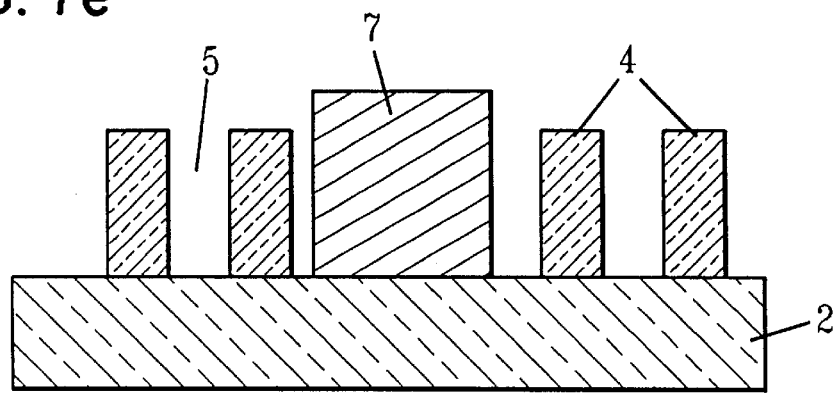

Pattern the dielectric 4 into pillars or lines, leaving gaps 5 (FIG. 7e). Patterning is preferably by an anisotropic etching process such as RIE. If the dielectric patterns have not been personalized to the wiring, fine alignment of lines/pillars with respect to wire 7 is not critical.

Figure 7F:
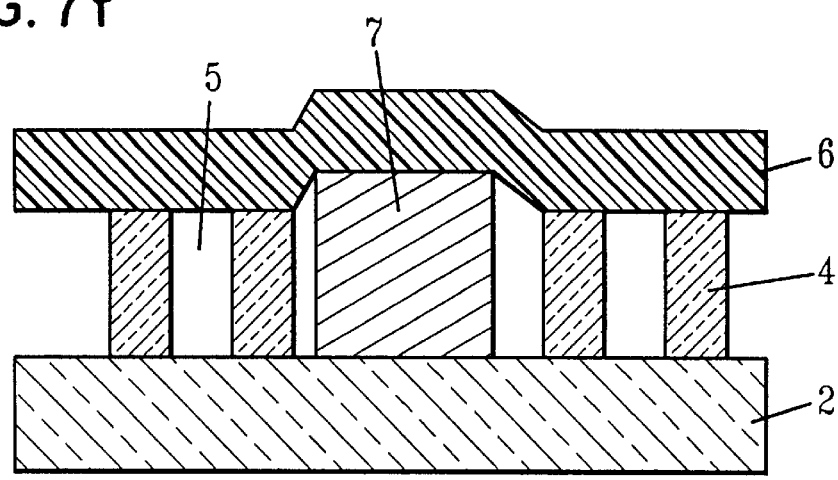

Deposit a thin layer of dielectric 6 over the structure (FIG. 7f). Dielectric 6 should be deposited in such a manner as to not fill gaps 5.

Figure 7G:
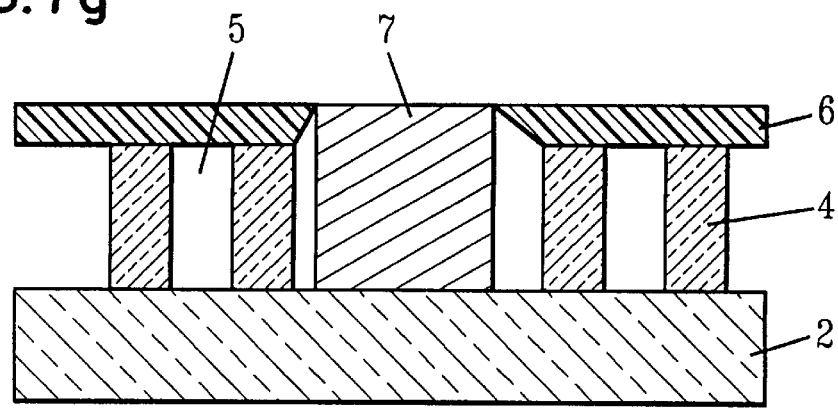

Planarize dielectric 6 to expose top surface of wire 7 (FIG. 7g).

While there has been described and illustrated a structured dielectric layer on a semiconductor chip between or within wiring metal levels wherein the dielectric layer contains narrow air gaps to form dielectric pillars or lines, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method to make structured dielectric layers comprising the steps of:

depositing a blanket layer of a first dielectric on a substrate etching circuit patterns into said first dielectric and blanket depositing a conductive wiring material to fill the circuit patterns, planarizing the wiring material and slightly overetching said first dielectric, patterning said first dielectric to form air gaps, depositing a thin layer of a second dielectric over said structure, and planarizing said second dielectric to expose the top surface of said wire.

* * * * *